United States Patent
Updegrove

(10) Patent No.: US 6,622,098 B2
(45) Date of Patent: Sep. 16, 2003

(54) AUTOMATED SYSTEM FOR CALCULATING MAGNETIC STRAY FIELD DATA ASSOCIATED WITH CURRENT LOOP CONFIGURATIONS

(75) Inventor: Darryl Updegrove, Panama City, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 49 days.

(21) Appl. No.: 09/985,964

(22) Filed: Oct. 16, 2001

(65) Prior Publication Data

US 2003/0074149 A1 Apr. 17, 2003

(51) Int. Cl.[7] .......................... G06F 19/00; G01R 33/00
(52) U.S. Cl. ............................ 702/65; 702/95; 702/150; 324/207.11
(58) Field of Search .............................. 702/57, 65, 94, 702/95, 150, 152, 153; 324/207.11, 207.13, 260; 345/173, 174, 178, 179

(56) References Cited

U.S. PATENT DOCUMENTS 5,558,091 A * 9/1996 Acker et al. ............ 324/207.11
5,833,608 A * 11/1998 Acker ........................ 324/260
6,427,314 B1 * 8/2002 Acker ........................... 29/593

* cited by examiner

*Primary Examiner*—Bryan Bui
(74) *Attorney, Agent, or Firm*—Harvey Gilbert; Donald G. Peck

(57) ABSTRACT

A system for calculating magnetic stray field data for current loop configurations. A graphical user interface utilizes multiple screens to define a current loop configuration, and prompt a user to select i) one of three orthogonal dipole directions in which the current loop configuration is aligned, ii) units of measure associated with the current loop configuration, and iii) one of a plurality of calculation scenarios. Calculation scenarios include i) current loop configuration defined by a single-size current loop, ii) current loop configuration defined by a non-uniform sized current loop, and current loop configuration defined as a single-size current loop and the user selects direction of simulated movement, start and stop positions along the movement direction and a step increment. A processor coupled to the graphipal user interface is programmed to perform magnetic stray field calculations for the selected calculation scenario. Calculations are displayed in graphical formats chosen by the user.

12 Claims, 4 Drawing Sheets

AUTOMATED SYSTEM FOR CALCULATING MAGNETIC STRAY FIELD DATA ASSOCIATED WITH CURRENT LOOP CONFIGURATIONS

ORIGIN OF THE INVENTION

The invention described herein was made in the performance of official duties by an employee of the Department of the Navy and may be manufactured, used, licensed by or for the Government for any governmental purpose without payment of any royalties thereon.

FIELD OF THE INVENTION

The invention relates generally to the automation of numerical analysis problems, and more particularly to an automated system for calculating magnetic stray field data associated with current loop configurations. The system provides the user with choices of input and output scenarios so that a variety of current loop designs can be evaluated with the same tool.

BACKGROUND OF THE INVENTION

As is known in the art, the magnitude M of the magnet dipole moment vector of a wire shaped in the form of a rectangular loop and having electric current flowing therethrough is determined by the product $$M=A*N*i$$

where A is the area enclosed by the rectangular loop, N is the number of turns of the loop, and i is the electric current flowing through the loop. For current loops with a small number of turns enclosing different areas, the magnetic dipole moment is calculated as the summation of the individual currents multiplied by the individual loop areas. The direction of the magnetic dipole moment vector is always normal to the plane of the current loop as determined by the "right hand rule".

Three sets of equations are available for calculating the magnetic dipole moment of a current loop. A first set of equations is used for current loop configurations that are designated as small loops. A second set of equations is used for current loop configurations that are designated as large normal loops. A third set of equations is used for current loop configurations designated as large narrow loops. Criteria for designation of a current loop configuration as being one of small, large normal or large narrow, and the corresponding sets of equations used to determine magnetic stray fields associated therewith, are described in "Military Handbook, Design of Electrical Equipment with Small Stray Magnetic Fields," MIL-HDBK-802, July, 1990.

The predetermined criteria definitions used to designate a current loop configuration will be briefly described. The small loop designation applies in situations where the current loop's length and width are relatively close to one another, but both are significantly smaller than the distance from the measurement point to any point on the current loop. The large normal loop designation applies in situations where both the current loop's length and width are large relative to the distance from the measurement point to any point on the current loop. The large narrow loop designation applies in situations where, once again, the current loop's size dimensions are large relative to the distance from the measurement point to any point on the current loop, but the current loop's length-to-width ratio is also large.

In addition, certain applications (e.g., mine or underwater target detection, underwater cable or pipeline detection, etc.) require the evaluation of a stationary current loop as an observation or measurement point moves past the current loop. However, this capability does not currently exist in the art of magnet stray field calculation for current loops.

SUMMARY OF THE INVENTION

Accordingly, it is an object of the present invention to provide a system for calculating magnetic stray field data associated with current loop configurations.

Another object of the present invention is to provide a current loop evaluation tool that can present magnetic stray field data associated with current loop configurations.

Still another object of the present invention is to provide a system for calculating and presenting magnetic stray field data for a variety of current loop configurations and for a variety of calculation scenarios.

Yet another object of the present invention is to provide a system for calculating and presenting magnetic stray field data for a situation defined by a stationary current loop and a moving measurement or observation point.

Other objects and advantages of the present invention will become more obvious hereinafter in the specification and drawings.

In accordance with the present invention, a system is provided for calculating magnetic stray field data associated with current loop configurations. A graphical user interface utilizes a plurality of screens to define a current loop configuration. More specifically, a first screen provides for the entry of data associated with a small loop and second screen provides for the entry of data associated with a large loop. The designation between small loop and large loop is predetermined. Each of the first and second screens prompts a user to select i) one of three orthogonal dipole directions in which the current loop configuration is aligned, ii) units of measure associated with the current loop configuration, and iii) one of a plurality of calculation scenarios.

The calculation scenarios include i) a first scenario in which the current loop configuration is defined by a single-size current loop and the user is prompted to enter a distance from a center of the single-size current loop to a point of observation, physical dimension data associated with said single-size current loop, number of turns of the single-size current loop and an amount of current that is to be simulated, and ii) a second scenario in which the current loop configuration is defined by a non-uniform sized current loop and the user specifies a data input file that defines the non-uniform sized current loop as a plurality of rectangular loops. The data input file specifies a distance from a center of each rectangular loop and a point of observation, physical dimension data associated with each rectangular loop, number of turns for each rectangular loop and an amount of current that is to be simulated. A processor is coupled to the graphical user interface and is programmed to perform magnetic stray field calculations in accordance with the selected one of the calculation scenarios for one of the small loop and large loop as selected via one of the first and second screens.

In the second calculation scenario, each of the first and second screens provides the user with a first option to store results of the magnetic stray field calculations to an output file, a second option to display results of the magnetic stray field calculations for each of the rectangular loops, and a third option to display results of the magnetic stray field calculations as a cumulative value for all of the rectangular loops. The graphical user interface accesses a third screen for graphically displaying the results of the magnetic stray field calculations for each of the rectangular loops when the second option is selected. The graphical user interface displays the cumulative value on one of the first or second screens when the third option is selected.

A third calculation scenario can be provided by the present invention. In this third scenario, the current loop configuration is defined as in the first scenario except that the user utilizes the graphical user interface to access a fourth screen via one of the first and second screens. The fourth screen prompts the user to select a movement direction from the three orthogonal dipole directions. The movement direction defines a direction of simulated movement past the current loop configuration. The user is also prompted to enter start and stop positions along the movement direction as well as a step increment. The magnetic stray field calculations are then performed along the movement direction at each step increment between the start and stop positions. Calculation results are determined relative to each of the three orthogonal dipole directions. The fourth screen graphically displays the results of magnetic stray field calculations at each step increment relative to each of the three orthogonal dipole directions.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
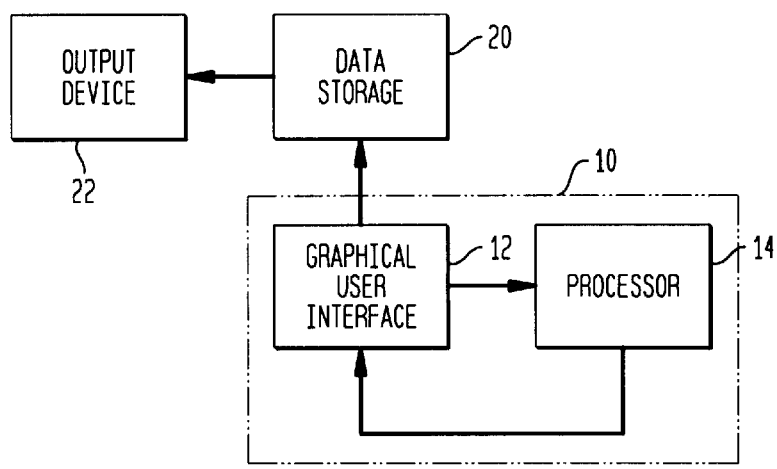
FIG. 1 is a top-level block diagram of a system for calculating and presenting magnetic stray field data associated with current loop configurations in accordance with the present invention.

Referring now to the drawings, and more particularly to FIG. 1, a system for calculating and presenting magnetic stray field data associated with a selected current loop configuration is shown in block diagram form and is contained in the dashed-line box referenced by numeral 10. System 10 serves as a current loop design evaluation tool that calculates and presents magnetic stray field data associated with any current loop configuration that falls into one of the small, large normal, or large narrow loop designations. While the choice of loop designation is predetermined by the user, system 10 provides the user with the ability to easily choose and/or switch designations and then calculate/recalculate results so that comparisons between loop designations can be easily made.

In general, system 10 includes a graphical user interface (GUI) 12 that prompts the user to i) input various loop configuration selections and corresponding input data, and ii) select from a variety of calculation scenarios and output data options. The selections and input data are provided to a processor 14 that performs the appropriate magnetic stray field calculations. The results of the calculations are passed back to GUI 12. The results of the magnetic stray field calculations can simply be stored in a data storage media 20 and subsequently sent to an output device 22 such as a printer. Additionally or alternatively, system 10 can present the results of the magnetic stray field calculations using GUI 12 as will be explained further below. In this way, system 10 presents a self-contained current loop design evaluation tool that can calculate and present magnetic stray field data associated with a user-specified current loop configuration. Since such a self-contained design tool has many obvious advantages, it is this embodiment of the present invention that will be explained herein.

Figure 2:
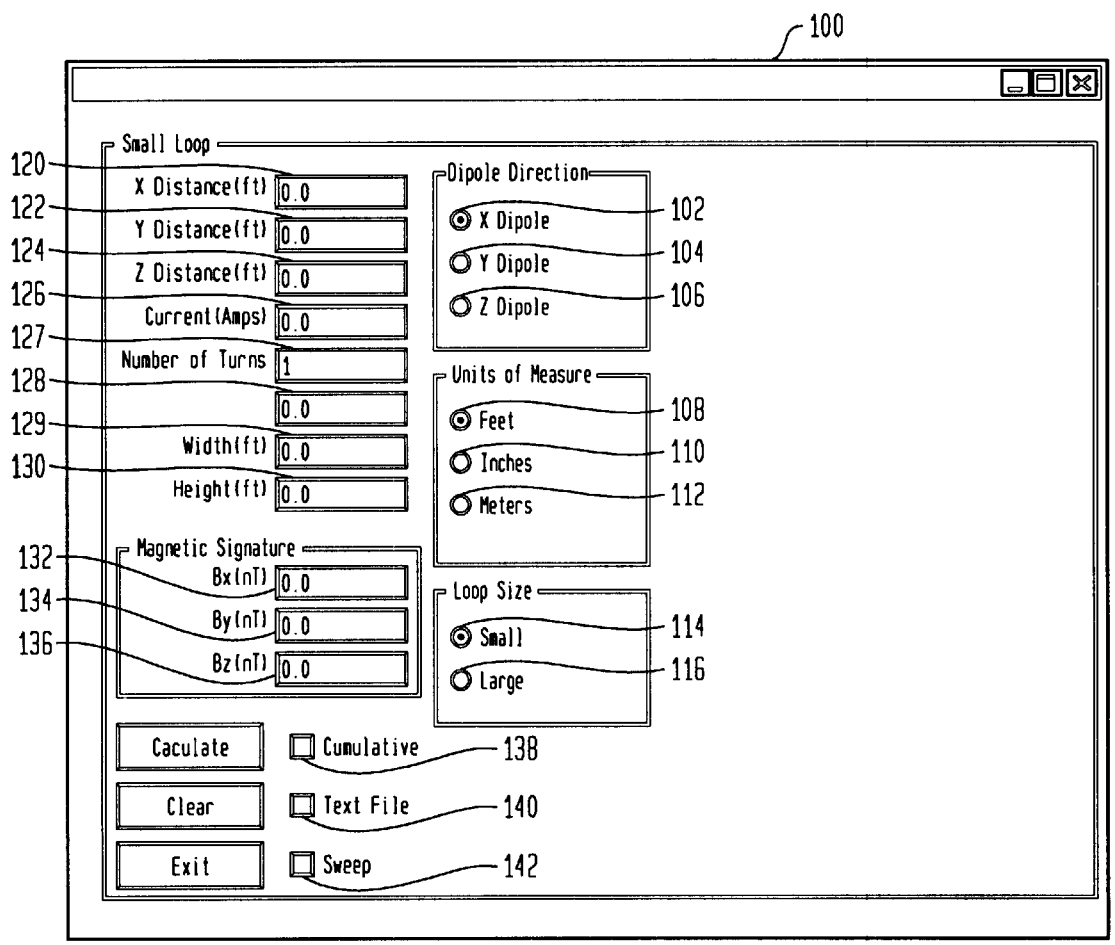
FIG. 2 is a diagrammatic view of a first screen of the WINDOWS-based graphical user interface used in the present invention.

GUI 12 will now be explained for the exemplary embodiment with the aid of FIGS. 2–7, where a plurality of screens demonstrative of GUI 12 are illustrated in FIGS. 2–3 and 5–7. By way of a non-limiting illustrative example, the graphical user interface is based on the MICROSOFT WINDOWS architecture. In FIG. 2, a first screen 100 serves as the initial default screen that the user will see when using the present invention. Specifically, first screen 100 assumes i) that the dipole direction (i.e., plane that the loop lies in) is the "X Dipole", ii) that the unit of measure for the input data are in feet, and iii) that the loop size is small. Accordingly, radio boxes 102, 108 and 114 are indicated as being selected as shown. However, if the user wants to select a different dipole direction and/or input units, or evaluate a large (normal or narrow) loop, the appropriate radio box can be selected. For example, if a large loop is to be evaluated, radio box 116 is selected and screen 200 (FIG. 3) will be accessed. The decision to use (small loop) screen 100 or (large loop) screen 200 rests with the user. As mentioned above, criteria for making this decision are set forth in the afore-referenced Military Handbook MIL-HDBK-802,the contents of which are hereby incorporated by reference.

Referring still to FIG. 2, assuming the user has selected a small loop size, the dipole direction and input data units of measure, screen 100 prompts the user to input the data that will be used in the magnetic stray field calculations. Further, screen 100 allows the user to select a calculation scenario that corresponds to the selected current loop configuration and input data associated therewith. For example, a first calculation scenario is required for a current loop configuration defined by a uniform or single-size current loop having 1 or more turns. In this scenario, the x, y and z component distances from the center of the loop to an observation or measurement point are entered via data entry windows 120, 122 and 124; the amount of current to be simulated is entered via data entry window 126; the number of turns in the current loop is entered via data entry window 127; and the loop dimensions are entered via two of data entry windows 128, 129 and 130. Note that for any given dipole direction, only two loops dimensions are used. To avoid user confusion, only the two relevant dimensions for a given dipole direction are identified adjacent the corresponding data entry window. For example, since the "X Dipole" is selected on screen 100, only the "Width" and "Height" dimensions are relevant and made visible on screen 100. The third dimension (i.e., "Length") is thus omitted from screen 100.

Since this is all of the data needed to evaluate the uniform or single-size current loop configuration, the "Calculate" button can be selected and the input data is then processed (e.g., by processor 14). The small loop equations (described in the afore-cited Military Handbook) used by processor 14 generate the magnetic stray fields in terms of their x, y and z components, i.e., $B_x$, $B_y$ and $B_z$. The x, y, z components are displayed in display windows 132, 134 and 136, respectively. At this point, the input and output windows on screen 100 can be cleared using the "Clear" button or the program can be quit using the "Exit" button.

Figure 4A:
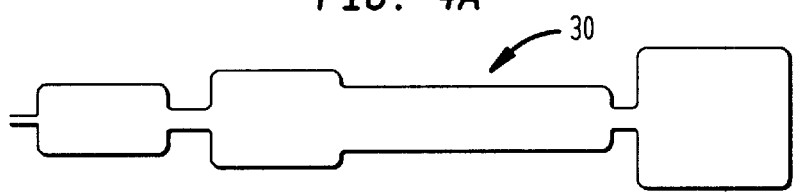
FIG. 4A is a schematic view of a non-uniform current loop traversed by a wire.
Figure 4B:
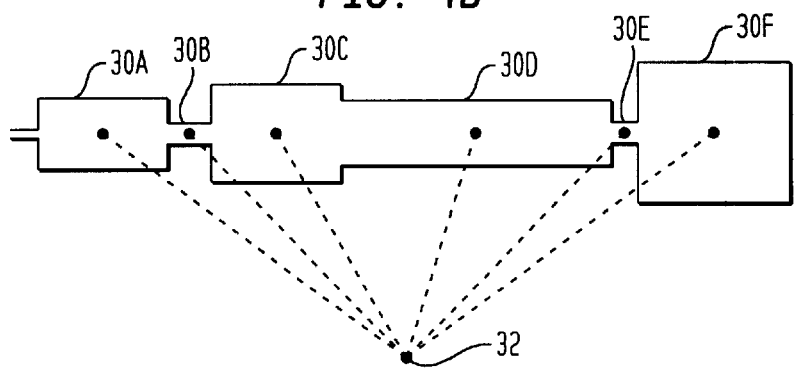
FIG. 4B is a rectangular representation of the non-uniform current loop shown in FIG. 4A.
Figure 5:
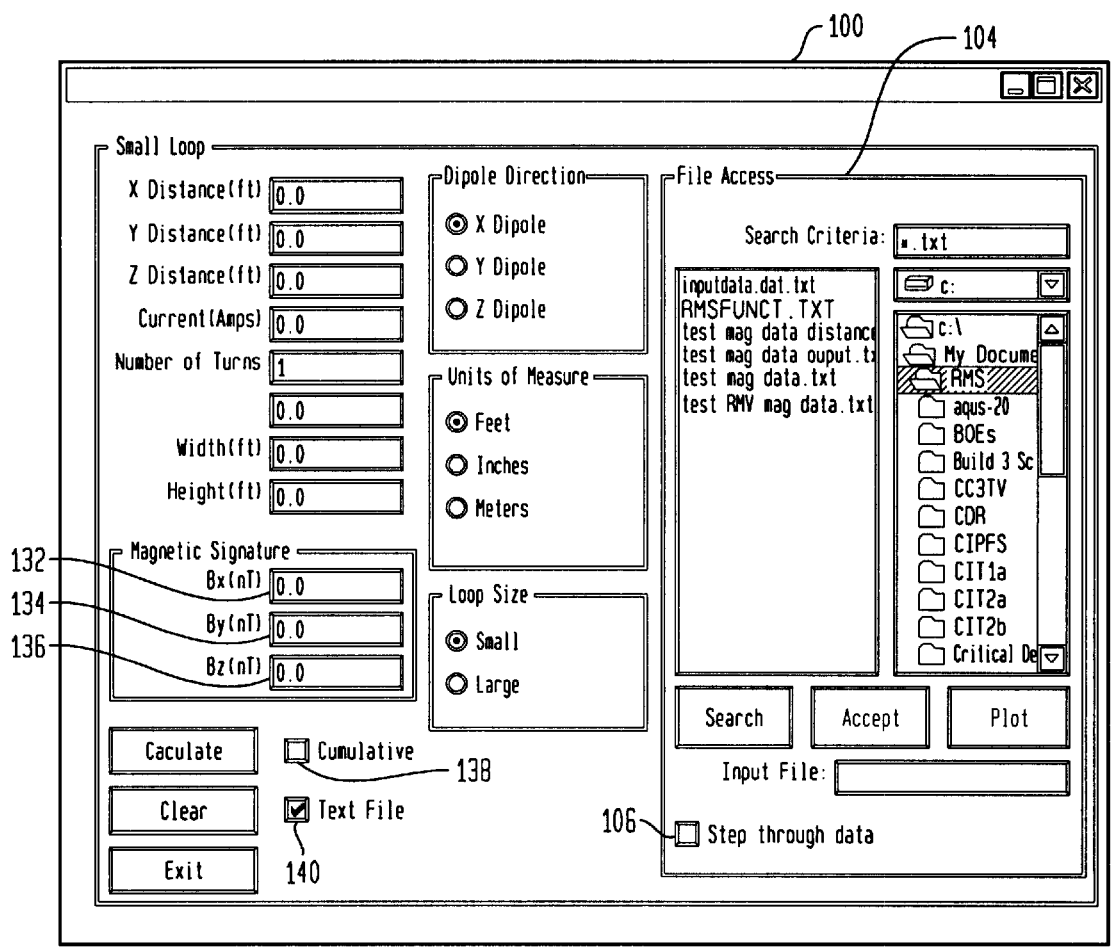
FIG. 5 is a diagrammatic view of the first screen of the WINDOWS-based graphical user interface when a non-uniform current loop is to be evaluated.
Figure 6:
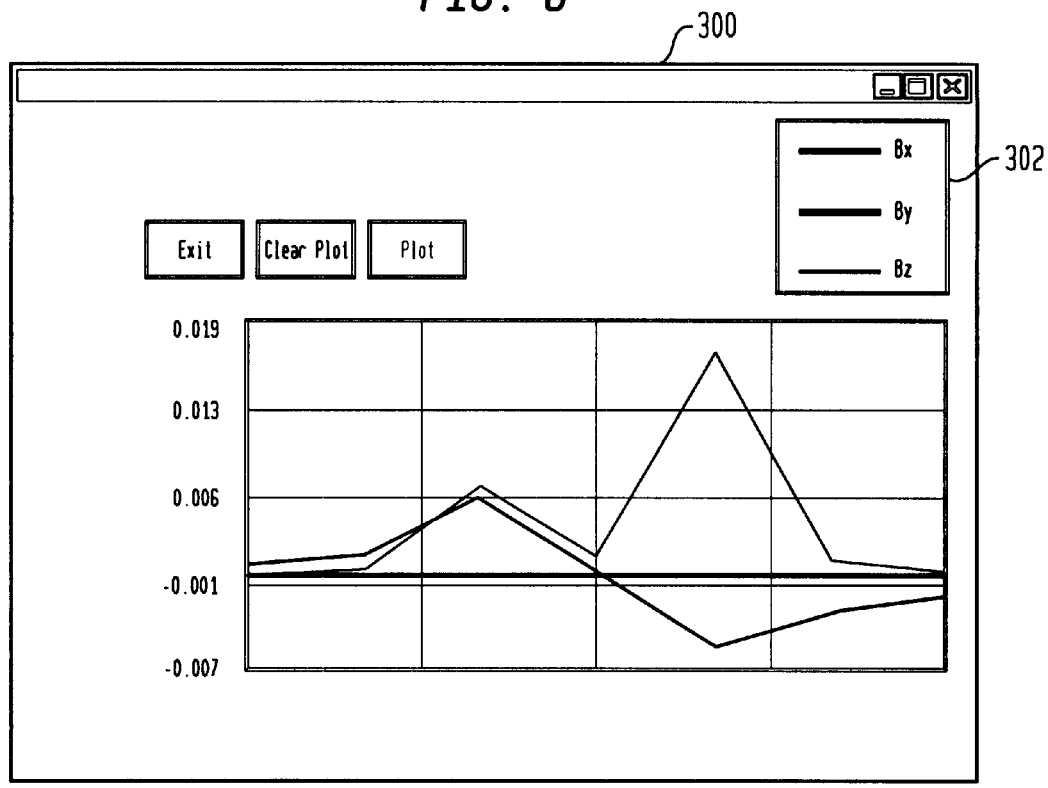
FIG. 6 is a diagrammatic view of a third screen of the WINDOWS-based graphical user interface depicting a plot of the stepwise calculations for a non-uniform current loop.
Figure 7:
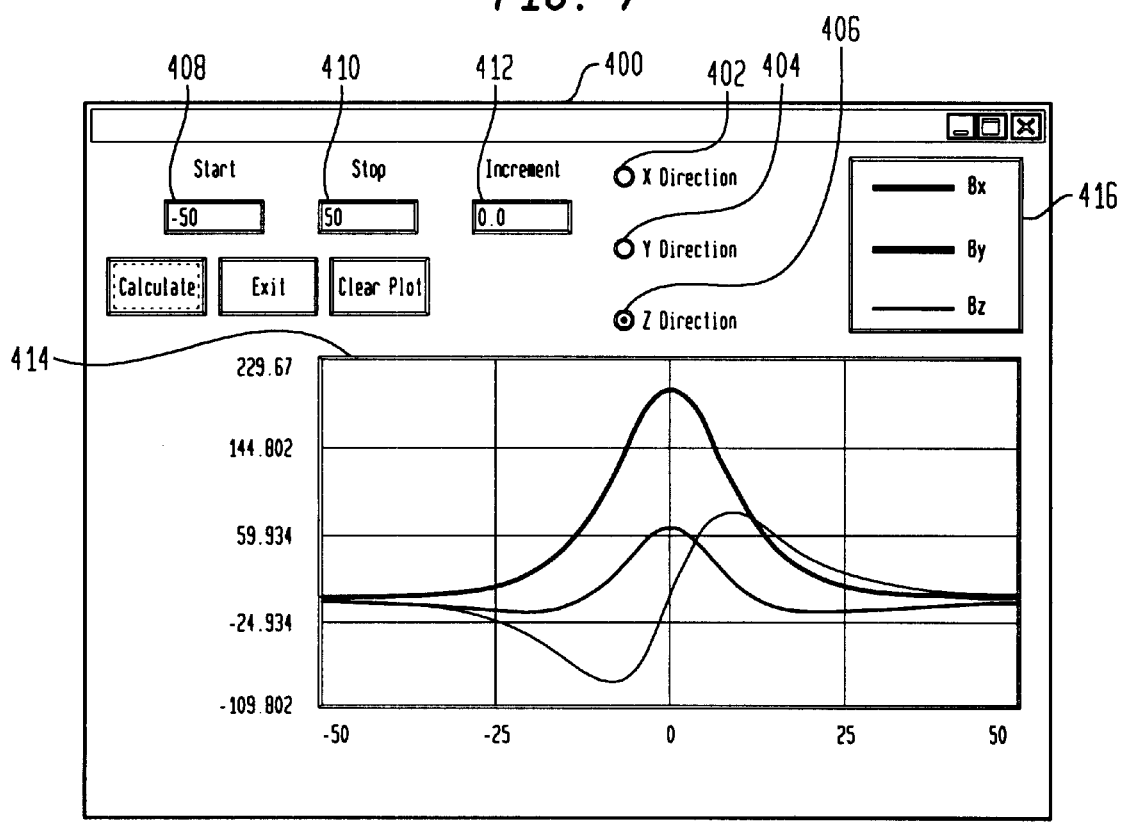
FIG. 7 is a diagrammatic view of a fourth screen of the WINDOWS-based graphical user interface depicting a sweep plot of the magnetic stray field data associated with a single size current loop and a moving observation/measurement point.

A second calculation scenario that can be handled by the present invention involves a non-uniform current loop such as current loop 30 illustrated in FIG. 4A. To evaluate magnetic stray fields for current loop 30 using the present invention, the geometry of loop 30 is simplified to a series of rectangular loops as illustrated in FIG. 4B. Specifically, FIG. 4B shows that loop 30 can be represented as six rectangles 30A–30F, each of which will be described for the same amount of current. However, each rectangle has its own physical dimension data associated therewith to include length, width and number of turns. Further, each rectangle's center is located a different distance from a selected observation or measurement point (e.g., point 32) as indicated by the dashed lines. To accommodate the large amount of data input required for this scenario, the present invention provides for data input via a data file that specifies the relevant data for each rectangle 30A–30F. Thus, for this scenario, check box 140 would be checked on screen 100 thereby causing screen 102 to appear as illustrated in FIG. 5.

Screen 102 has a file access area 104 where an input file can be searched for or specified in ways well understood in the art. After an input file has been selected, a file for receiving the results of the magnetic stray field calculations can be selected by once again selecting check box 140 and designating an output file. The results can also be immediately displayed by the present invention. If a cumulative magnetic stray field result is desired, check box 138 is selected and the x, y, z component results are displayed in display windows 132, 134 and 136, respectively, after the "Calculate" button is selected. However, the present invention also allows the user to view the results in a stepwise fashion by selecting check box 106 in file access area 104. In this case, after the "Calculate" button is selected, screen 300 (FIG. 6) appears to plot the x, y, z components of the magnetic stray field calculated for each rectangle in the non-uniform current loop (e.g., rectangles 30A–30F). Plot points for each component are connected by a colored line specified in legend area 302.

A third calculation scenario that can be addressed by the present invention involves a single-size current loop (having one or more turns) that is to be evaluated as an observation or measurement point moves thereby. That is, the present invention also allows a user to evaluate how magnetic stray fields from a stationary current loop change as a measurement platform changes its position relative thereto. This scenario will find great utility in the field of underground or underwater mine or target detection and classification, buried cable detection, buried pipeline detection, etc.

Referring again to FIG. 2, to implement this third calculation scenario (e.g., for a small loop configuration), the single size current loop configuration is entered as described above, except that any x, y and z distances from an observation/measurement point entered via windows 120, 122, and 124 are ignored. This is because the observation/measurement point will change throughout the calculations. More specifically, check box 142 is selected and the user is transferred to screen 400 illustrated in FIG. 7. On screen 400, the user selects one of the x, y, z planes in which movement will occur using one of radio boxes 402, 404 and 406. The user enters start and stop positions for the observation/measurement point via windows 408 and 410. The step increment between calculation points is entered via window 412. After the "Calculate" button is selected, magnetic stray field calculations are preformed for each incremental observation/measurement point dictated by what was entered in windows 408, 410 and 412. Thus, at each increment, the present invention recalculates the x, y, z distances from the new observation point to the current loop's center. Such calculation is a standard geometrical calculation as would be understood by one of ordinary skill in the art. The multiple magnetic signature components $B_x$, $B_y$ and $B_z$ are displayed as a continuous curve in graphical plot area 414. Color coding of each curve is specified in legend area 416.

Figure 3:
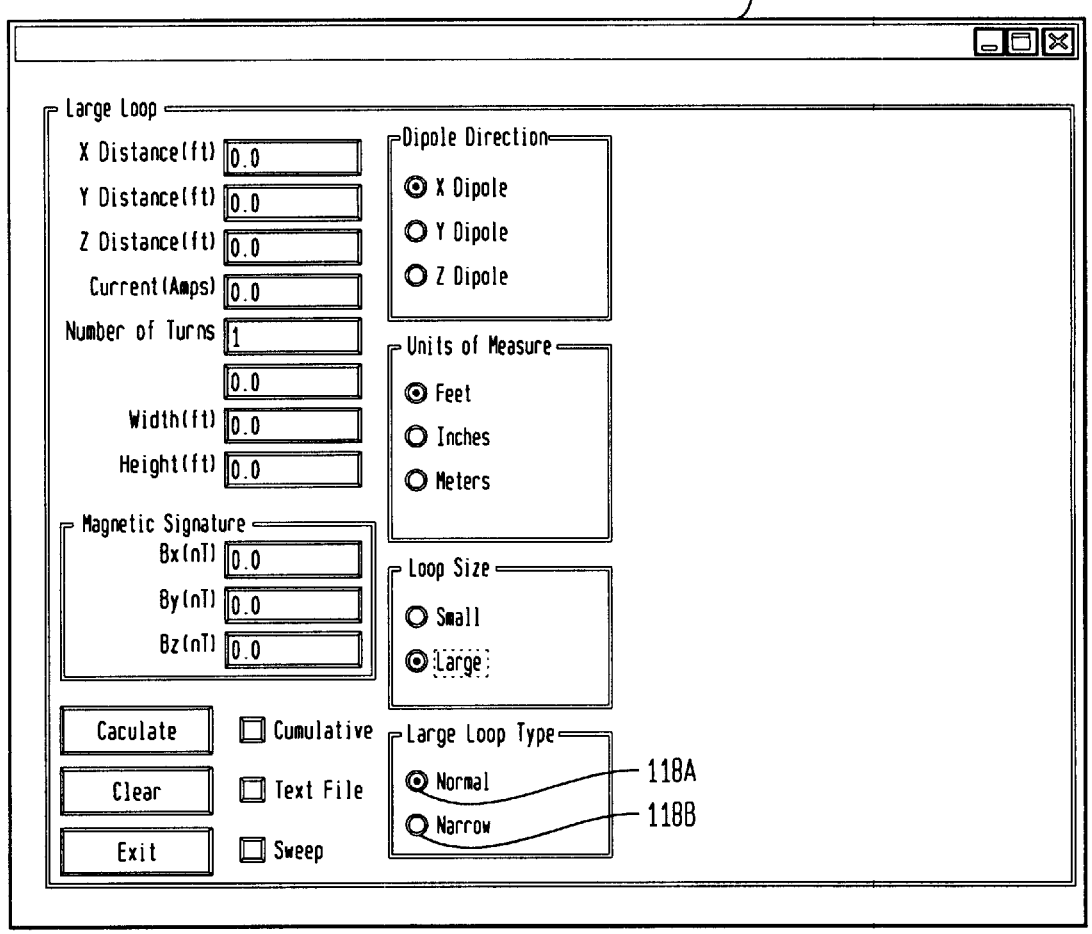
FIG. 3 is a diagrammatic view of a second screen of the WINDOWS-based graphical user interface.

As mentioned above in the description, if the user chooses to perform calculations for a large loop configuration, check box 116 (FIG. 2) is selected and the user is transferred to screen 200 illustrated in FIG. 3. On screen 200, the user has the option of specifying the large loop as being normal (via radio box 118A) or narrow (via radio box 118B). The choice of normal or narrow dictates which sets of equations are used to perform the magnetic stray field calculations. Since the remainder of screen 200 is identical in appearance and function to that of screen 100, no additional description of screen 200 is required.

The advantages of the present invention are numerous. Magnetic stray field data associated with current loop(s) can be quickly calculated and presented for a variety of different current loop configurations. The current loop configurations can be a uniform single-size loop or a non-uniform loop. The single-size loop can also be evaluated from a "moving" observation/measurement point. Data input can be easily changed with subsequent re-calculations using a choice of calculation scenarios. The system is a self-contained current loop design evaluation tool that provides the user with nearly instantaneous presentation of magnetic stray field data associated with a current loop design. Changes are facilitated by the graphical user interface so that the user can evaluate a variety of designs easily and efficiently.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A system for calculating magnetic stray field data associated with current loop configurations, comprising:
    a graphical u ser interface having a plurality of screens for defining a current loop configuration, said plurality of screens including i) a first screen for entering data associated with a small loop, and ii) a second screen for entering data associated with a large loop, wherein a designation of said current loop configuration as being one of said small loop and said large loop is defined by predetermined criteria;

each of said first screen and said second screen prompting a user to select i) one of three orthogonal dipole directions in which said current loop configuration is aligned, ii) units of measure associated with said current loop configuration, and iii) one of a plurality of calculation scenarios;

said plurality of calculation scenarios including i) a first scenario in which said current loop configuration is defined by a single-size current loop and said user is prompted to enter a distance from a center of said single-size current loop to a point of observation, physical dimension data associated with said single-size current loop, number of turns of said single-size current loop and an amount of current that is to be simulated, and ii) a second scenario in which said current loop configuration is defined by a non-uniform sized current loop and said user specifies a data input file that defines said non-uniform sized curent loop as a plurality of rectangula loops, wherein said data input file specifies a distance from a center of each of said plurality of rectangular loops and a point of oservation, physical dimension data associated with each of said plurality of rectangular loops, number of turns for each of said plurality of rectangular loops and an amount of current that is to be simulated;

a processor coupled to said graphical user interface and programmed to perform magnetic stray field calculations in accordance with said one of said plurality of calculation scenarios for one of said small loop and said large loop as selected via one of said first screen and said second screen; and each of said first screen and said second screen providing, in said second scenario, said user with a first option to store results of said magnetic stray field calculations to an output file, a second option to display results of said mangetic stray field calculations for each of said plurality of rectangular loops, and a third option to display results of said magnetic stray field calculations as a cumulative value for all of said plurality of rectangular loops.

2. A system as in claim 1 wherein said graphical user interface is a Windows-based graphical user interface.

3. A system as in claim 1 wherein each of said first screen and said second screen prompt said user to specify a location for said data input file when said second scenario is selected from said plurality of calculation scenarios.

4. A system as in claim 1 wherein each of said first screen and said second screen prompt said user to specify a location for said output file when said first option is selected.

5. A system as in claim 1 wherein said plurality of screens further includes a third screen for graphically displaying said results of said magnetic stray field calculations for each of said plurality of rectangular loops when said second option is selected.

6. A system as in claim 1 wherein each of said first screen and said second screen include display areas for displaying said cumulative value in each of said three orthogonal dipole directions when said third option is selected.

7. A system as in claim 6 wherein said display areas further display results of said magnetic stray field calculations when said first scenario is selected from said plurality of calculation scenarios.

8. A system as in claim 1 wherein said plurality of calculation scenarios further include a third scenario in which said current loop configuration is defined as in said first scenario, and wherein said graphical user interface further has a sweep screen accessed via one of said first screen and said second screen, said sweep screen prompting said user to i) select a movement direction from said three orthogonal dipole directions wherein said movement direction defines a direction of simulated movement past said current loop configuration defined in said third scenario, ii) enter start and stop positions along said movement direction, and iii) enter a step increment wherein said magnetic stray field calculations are performed along said movement direction at each said step increment between said start and stop positions and relative to each of said three orthogonal dipole directions, said sweep screen graphically displaying said results of magnetic stray field calculations at each said step increment relative to each of said three orthogonal dipole directions.

9. A current loop design evaluation tool for calculating and presenting magnetic stray field data associated with current loop configurations, comprising:

a graphical user interface having a plurality of screens for defining a current loop configuration, said plurality of screens including i) a first screen for entering data associated with a small loop, and ii) a second screen for entering data associated with a large loop, wherein a designation of said current loop configuration as being one of said small loop and said large loop is defined by predetermined criteria;

each of said first screen and said second screen prompting a user to select i) one of three orthogonal dipole directions in which said current loop configuration is aligned, ii) units of measure associated with said current loop configuration, and iii) one of a plurality of calculation scenarios;

said plurality of calculation scenarios including i) a first scenario in which said curent loop configuration is defined by a single-size current loop and said user is prompted to enter a distance from a center of said single-size current loop to a point of observation, physical dimension data associated with said single-size current loop, number of turns of said single-size current loop and an amount of current that is to be simulated, and ii) a second scenario in which said current loop configuration is defined by a non-uniform sized current loop and said user specifies a data input file that defines said non-uniform sized current loop as a plurality of rectangular loops, wherein said data input file specifies a distance from a center of each of said plurality of rectangular loops and a point of observation, physical dimension data associated with each of said plurality of rectangular loops, number of turns for each of said plurality of rectangular loops and an amount of current that is to be simulated;

a processor coupled to said graphical user interface and programmed to perform magnetic stray field calculations in accordance with said one of said plurality of calculation scenarios for one of said small loop and said large loop as selected via one of said first screen and said second screen;

each of said first screen and said second screen providing, in said second scenario, said user with a first option to store results of said magnetic stray field calculations to an output file, a second option to display results of said magnetic stray field calculations for each of said plurality of rectangular loops, and a third option to display results of said magnetic stray field calculations as a cumulative value for all of said plurality of rectangular loops;

said plurality of screens further including a third screen or graphically displaying said results of said magnetic stray field calculations for each of said plurality of rectangular loops when said second option is selected;

each of said first screen and said second screen having display areas for displaying said cumulative value in each of said three orthogonal dipole directions when said third option is selected and for displaying results of said magnetic stray field calculations when said first scenario is selected from said plurality of calculation scenarios;

said plurality of calculation scenarios further including a third scenario in which said current loop configuration is defined as in said first scenario; and said plurality of screen further including a fourth screen accessed via one of said first screen and said second screen, said fourth screen prompting said user to i) select a movement direction from said three orthogonal dipole directions wherein said movement direction defines a direction of simulated movement past said current loop configuration defined in said third scenario, ii) enter start and stop positions along said movement direction, and iii) enter a step increment wherein said magnetic stray field calculations are performed along said movement direction at each said step increment between said start and stop positions and relative to each of said three orthogonal dipole directions, said fourth screen graphically displaying results of said magnetic stray field calculations at each said step increment relative to each of said three orthogonal dipole directions.

10. A current loop design evaluation tool as in claim 9 wherein said graphical user interface is a Windows-based graphical user interface.

11. A current loop design evaluation tool as in claim 9 wherein each of said first screen and said second screen prompt said user to specify a location for said data input file when said second scenario is selected from said plurality of calculation scenarios.

12. A current loop design evaluation tool as in claim 9 wherein each of said first screen and said second screen prompt said user to specify a location for said output file when said first option is selected.

* * * * *